United States Patent [19]

Stengl

[11] Patent Number: 4,894,549
[45] Date of Patent: Jan. 16, 1990

[54] APPARATUS FOR DEMAGNIFICATION OR FULL-SIZE ION PROJECTION LITHOGRAPHY

[75] Inventor: Gerhard Stengl, Kärnten, Austria

[73] Assignee: IMS Ionen Mikrofabrikations Systeme Gesellschaft m.b.H., Vienna, Austria

[21] Appl. No.: 164,106

[22] Filed: Mar. 4, 1988

[30] Foreign Application Priority Data

Mar. 5, 1987 [AT] Austria ............................... 507/87

[51] Int. Cl.$^4$ .............................................. H01J 27/00
[52] U.S. Cl. ............................ 250/492.2; 250/492.3; 250/281; 250/396 R; 250/398
[58] Field of Search ............. 250/492.3, 492.21, 492.2, 250/396 R, 398, 309, 281

[56] References Cited

U.S. PATENT DOCUMENTS

| | | | |
|---|---|---|---|
| 4,697,086 | 9/1987 | Ishitani et al. | 250/492.2 |
| 4,710,639 | 12/1987 | Sawaragi | 250/398 |
| 4,757,208 | 7/1988 | McKenna et al. | 250/492.21 |
| 4,823,011 | 4/1989 | Stengl et al. | 250/491.1 |
| 4,835,399 | 5/1989 | Hosaka et al. | 250/492.2 |

FOREIGN PATENT DOCUMENTS 60-74249 4/1985 Japan .
1211825 2/1986 U.S.S.R. ........................ 250/492.3

OTHER PUBLICATIONS

Stengl et al., Sol. State Technol., Feb. 1986.
Stengl et al., Technical Proceedings, Semi–Con/West, May 1986.
Stengl et al., Nuclear Instruments and Methods in Physics Research, Feb. 1987.
Burggraaf, Semiconductor International, Jul. 1985.
Bohlander, An Achromatic Mass Filter Employing Permanent Magnets for the Delft Ion Beam Pattern Generator, Microelectronic Engineering, 7, 1987.
E. Miyauchi et al.,-Computer Control of Maskless Ion Implanter..., Nucl. Instr. & Meth. in Physics Research B6, 183 (1985).
Bernheim et al.,-Ion Implantation, vol. 8, p. 446 (G. Dearnaley et al., North Holland Publ. Comp., 1973).
Gerhard Stengl et al., Ion Projection Lithography, Solid State Technology, (Feb. 1986), pp. 119-125.

Primary Examiner—Carolyn E. Fields
Assistant Examiner—John A. Miller

[57] ABSTRACT

An ion projection lithography system provides an immersion lens between the mask and the substrate, a mask between the immersion lens and the ion source and ExB fiter between the mask and the source but cooperating with a diaphragm located close to the crossing point or focal point of the immersion lens so that ions of undesired mass are rejected from the beam by impingement upon the diaphragm while utilizing low magnetic and electrical field strengths of the ExB filter.

18 Claims, 4 Drawing Sheets

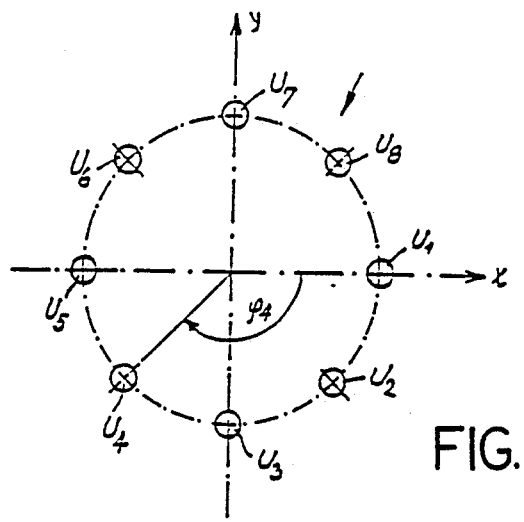
FIG. 2
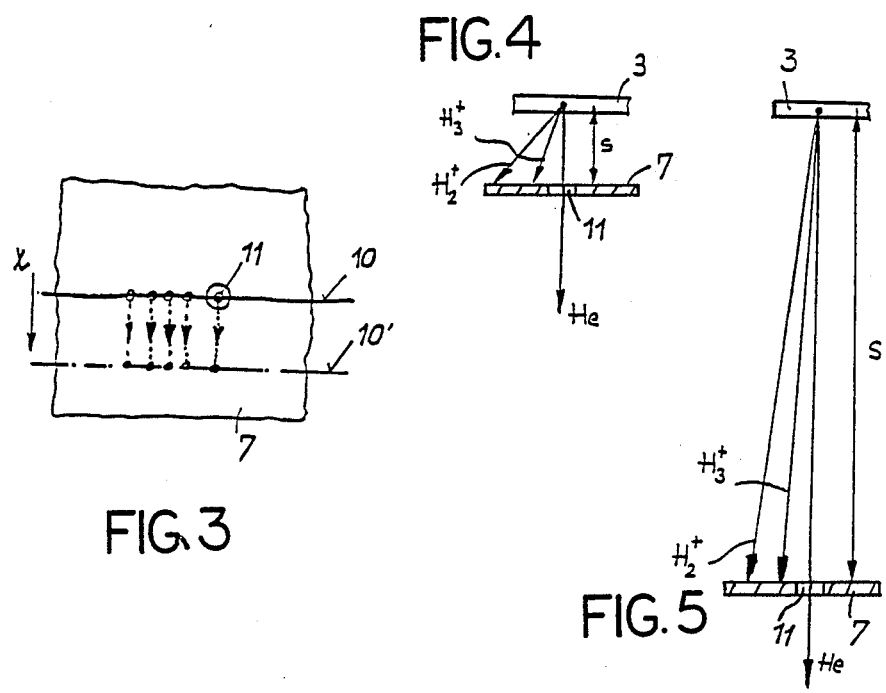
FIG. 4
FIG. 3
FIG. 5

4,894,549

APPARATUS FOR DEMAGNIFICATION OR FULL-SIZE ION PROJECTION LITHOGRAPHY

CROSS REFERENCE TO RELATED APPLICATIONS

The present application is related to the commonly assigned copending applications Ser. No. 07/062,464, now abandoned, filed 8 May 1987 and 07/050,978, now U.S. Pat. No. 4,823,011, filed 15 May 1987.

FIELD OF THE INVENTION

My present invention relates to an apparatus for demagnification or full-size (1:1) ion projection lithography and, more particularly, to an apparatus for structuring a substrate which usually is a semiconductor wafer in the projection of semiconductive electronic circuit elements on such wafers.

BACKGROUND OF THE INVENTION

In general, an ion projection lithographic apparatus for the formation of an image of a structured mask, i.e. a mask provided with openings passing an ion beam, upon a substrate such as a silicon or other semiconductor wafer, will comprise an ion source generating the ion beam, a structured mask along the path of the beam, and an immersion lens between the mask and the wafer.

A projection lens, for example in the form of a Einzel lens unit, can be provided also in the path of the beam. Ion sources generally supply a mixture of ions and thus it is not uncommon for a helium ion source to also provide in addition to the desired helium ions, hydrogen ions which are not desired for the ion exposure and imaging on the substrate.

It is already known to exclude undesired ions, based upon their masses, originally present in an ion beam, from the beam before these ions reach the projection lens. In Miyauchi et al, Nucl. Instr. & Meth. in Physics Research B6, 183 (1985), an apparatus for maskless ion implantation in which, downstream of the ion source an ExB filter (Wien filter) can be provided, directly followed by a diaphragm. In the ExB filter, crossed electric and magnetic fields are generated, under the combined effect of which different ions of the same energy are subjected to different deflections, whereby, with appropriate setting of the electrical and magnetic fields, only ions of the desired mass will remain undeflected or so deflected as to pass through the diaphragm.

This apparatus is, however, only poorly suited for ion projection lithography, since the rays which pass out of the ExB filter are divergent, with an aperture angle of, for example 6. In order that the diaphragm directly downstream of the ExB filter can intercept the ions of undesired masks, these must be very sharply deflected by the ExB filter. This implies the need for very high electrical and magnetic field strengths at the Wien filter which are associated with strong inhomogenous boundary or edge fields contributing distortion to the image of a mask when the apparatus is used in ion projection lithography.

Another known apparatus is described in "Ion Implantation", Vol. 8, p. 446 (G. Dearnaley et al., North Holland Publ. Comp., 1973). In this arrangement proposed by M. Bernheim et al (4th Int. Conf. on Electron and Ion Beam Science and Technology, Los Angeles), downstream of the ion source, a magnet is provided which sharply deflects ions of different masses. Depending upon the adjustment of the magnetic field, only ions of a predetermined desired mass traverse the further elements of the imaging system. This method has, however, the serious drawback that the source cannot lie on the optical axis of the imaging lens system since the magnetic field deflects all ions, including those of desired mass.

Mention may also be made of the description of a Wien Filter in "Ion Projection Lithography" in Solid State Technology February 1986, page 119 to 125.

Japanese patent document 60-74249 appears to describe a maskless focusing ion beam system in which the ion beam is scanned over a substrate. This system is not described in conjunction with demagnification or 1:1 ion projection lithography through a mask foil which is structured, i.e. provided with openings and, while a diaphragm is described in this system, there appears to be no basis for assuming that this diaphragm, if used in conjunction with an ExB, would be provided other than directly adjacent the ExB filter as in the art previously discussed.

OBJECTS OF THE INVENTION

It is, therefore, the principal object of the present invention to provide an ion projection lithography apparatus utilizing a structured mask and having the capacity of ion separation or undesired ion rejection which avoids the drawbacks outlined above.

Another object of this invention is to provide an ion projection lithography apparatus utilizing a structured mask but in which the ion source can be located along the optical axis of the lens system and, moreover, unusual high magnetic and electric field strengths will not be required in the ExB filter.

SUMMARY OF THE INVENTION

These objects and others which become apparent hereinafter are attained, in accordance with the present invention in an apparatus for demagnification or full-size ion projection lithography, comprising:

an ion source for projecting an ion beam along a path;
a structured mask disposed along the path;
a substrate disposed along the path and receiving an image of the structure of the mask projected onto the substrate by the ion beam;
an immersion lens between the mask and the substrate along the path for focussing the ion beam and forming a crossing point for ion rays thereof;
a projection lens along the path;
a Wien ExB mass-separation filter along the path between the source and the mask; and
a diaphragm cooperating with the Wien ExB mass-separation filter and provided with an aperture passing a predetermined kind of ions generated by the source and intercepting ions different from the predetermined kind upon deflection by the unit, the diaphragm being positioned between the immersion lens and the substrate at a substantial distance from the Wien ExB mass-separation filter.

Preferably the projection lens is a Einzel-lens unit and the substrate is a wafer, especially a silicon wafer, which is formed into semiconductor circuit elements by ion projection lithography.

The invention which eliminates the disadvantages of the conventional methods for ion separation by mass provides, therefore, the Wien filter between the source and the mask, but locates the diaphragm which intercepts the undesired ions downstream of the immersion lens and indeed immediately upstream of the location at which the immersion lens generates an image of the ion source.

Advantageously, the diaphragm opening has a dimension of about 500 micrometers. The aperture is preferably circular although it can also be rectangular or square. When it is a circular aperture, its diameter is 500 micrometers and when it is a square aperture, the aperture may be 500 micrometers wide on a side. The length of the rectangular aperture may be 500 micrometers.

Since the diaphragm is located, in accordance with the invention, at a point along the beam path in which the beam has a small diameter, but with a relatively large distance from the Wien filter, the undesired ions of rejectable mass need be deflected through small angles to ensure that they will not pass through the diaphragm or stated otherwise, will be intercepted by it. This can be effected with relatively small field strengths at the Wien filter so that distortion-producing edge fields and the resulting image distortion will be minimal and below tolerances.

The invention permits altering the gas mixture supplied to the ion beam source and thus the imaging of the mask structure upon the substrate with one and the same desirable ion type.

In addition, the apparatus of the invention can permit the replacement of one ion type by another ion type from the same ion source, utilizing the same gas medium therein, simply by changing the field strengths so that one and the same wafer can be exposed to two or more ion types without altering the position of the wafer and creating alignment problems.

Advantageously the diaphragm is built into or integrated in the projection lens which affords a simplification of the structure of the apparatus of the invention.

It has been found to be advantageous, moreover, to provide between the ion source and the Wien filter, a prefocusing or preliminary convergence electrostatic lens which is advantageously formed as a single lens unit. The convergent beam of the prelens can have its crossing point in the Wien filter.

By means of the prelens, the ion source can be imaged in the optical axis of the Wien filter with a scale of 1:1 to 1:2, thereby minimizing the image distortion of the Wien filter. When the prelens is eliminated, which is a practical solution according to the invention, the ion beam enters the Wien filter with a divergency arising in the ion source.

According to another feature of the invention, between the diaphragm and the source and preferably close to the diaphragm at the upstream side thereof, a further beam deflector is provided which is selectively activatable and generates an electrostatic deflection field. This deflector can be a multipole and especially an octopole.

By activation of the deflector, the ions which fan out from the Wien filter as a function of mass, can be deflected, for example, perpendicular to the fanning direction so that no ions will continue to impinge upon the diaphragm. Thus the mask is further irradiated by the beam. This helps to maintain the temperature of the mask constant but nevertheless permits the rays to be intercepted before reaching the wafer. The electrostatic deflector thus functions as a shutter for terminating or permitting exposure of the substrate to the beam without the drawbacks of a mechanical shutter (vibration and closing delay). The use of the electrostatic deflector also has the advantage that upon shutoff it can immediately restore the projected image, which ensures accurate positioning of the new image with respect to the substrate, eliminating problems with alignment when it is desired to project the subsequent image at an original desired location on the wafer.

BRIEF DESCRIPTION OF THE DRAWING

The above and other objects, features and advantages of the present invention will become more readily apparent from the following description, reference being made to the accompanying drawing in which:

FIG. 2 is a diagram of the action of a multipole in this system;

FIG. 3 is a diagram illustrating principles of the operation;

FIGS. 4 and 5 are elevational views diagrammatically illustrating different diaphragm arrangements to ensure the principles of the invention.

SPECIFIC DESCRIPTION

Figure 1:
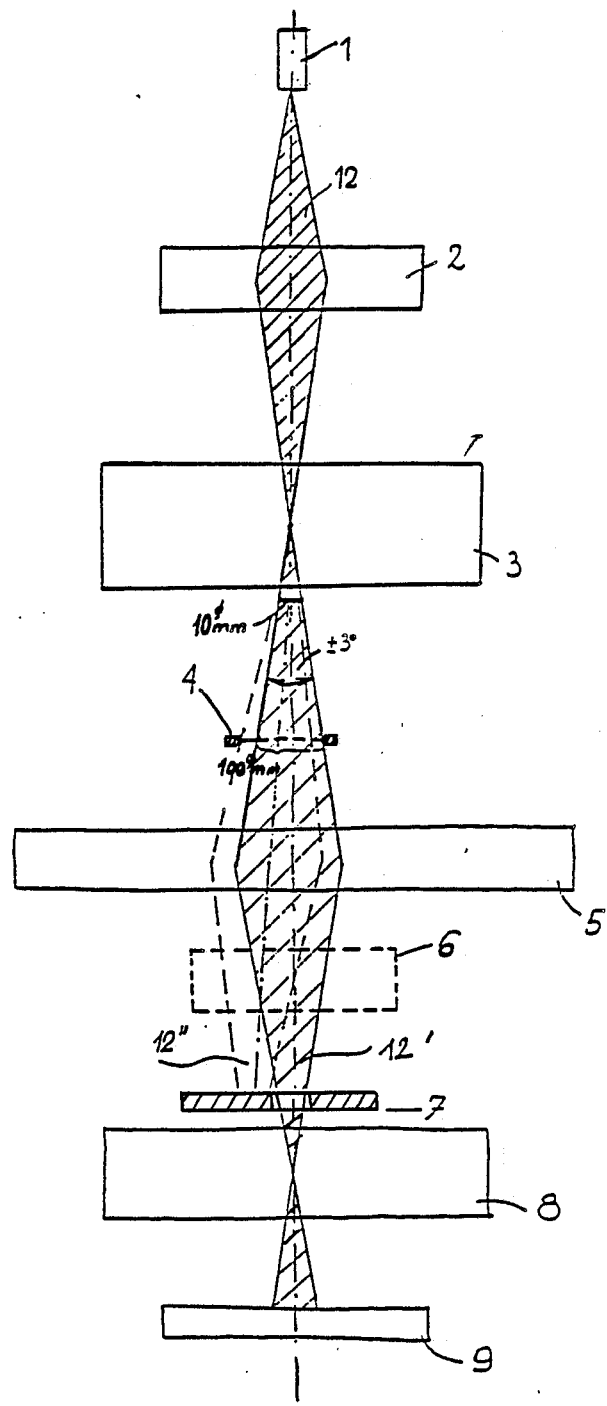
FIG. 1 is a vertical elevation diagrammatically illustrating a demagnification ion projection lithographic apparatus.

The ion source 1 shown in the drawing serves to produce an ion beam along the optical axis and extending along a beam path which is generally vertical for ion projection lithography.

In this path, a mask 4 is provided and has a structuring, i.e. openings through which the ion beam is to pass to structure a substrate. A substrate 9, which can be a wafer and which can be mounted upon a table capable of shifting the wafer relative to the optical axis and provided with means for properly aligning the substrate along the optical axis, is also provided along this path.

Such alignment means are standard in ion projection lithography apparatuses and have not been illustrated or described here.

Between the mask 4 and the substrate 9, an immersion lens 5 is provided along the optical axis and serves to accelerate the ions to the desired final energy for the structuring of the substrate, e.g. the silicon wafer. The immersion lens 5 transforms the beam into a convergent beam which has a crossing point located below the immersion lens 5 and generally represented at CP in FIG. 1.

A projection lens 8 is located between the immersion lens 5 and the substrate, if desired, and preferably is an Einzel lens.

Figure 1A:
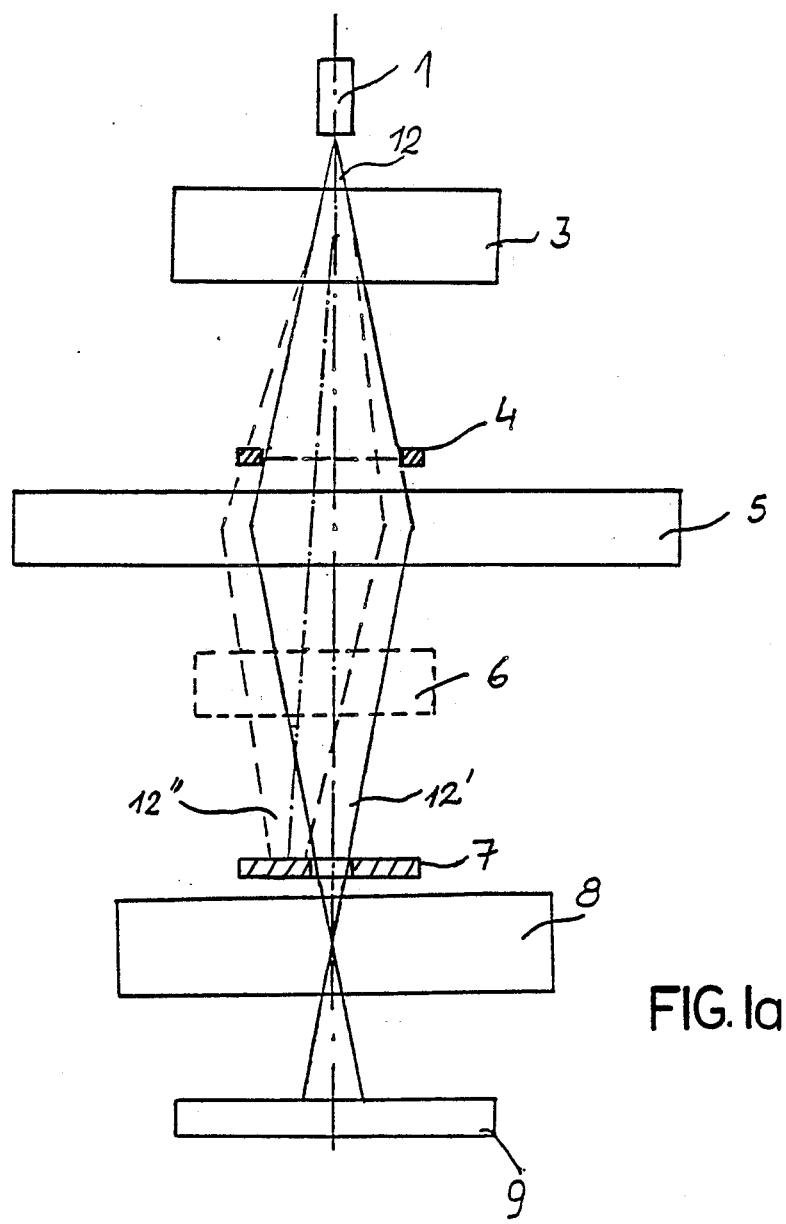
FIG. 1a is a similar view of an apparatus for the same purpose, provided without the precondensing lens of the apparatus of FIG. 1.

As can be seen from FIGS. 1 and 1a, the immersion lens 5 focuses the image of the ion source 1 in the projection lens 8, i.e. the crossing point CP is located within the projection lens 8.

The ion source 1 supplies a divergent ion beam 12 of different types of ions, it being generally the rule that only one ion type is desirable for projection.

Thus the source 1 may supply helium ions which are the desired ion type and in addition to the He ions, also can produce $H^+$ ions, $H_2^+$ and $H_3^+$ ions which are not desired as part beam impinging upon the substrate 9 and which are, according to the invention, separated by mass from the beam which will impinge upon the substrate.

To this end, between the ion source 1 and the mask 4, a Wien filter 3, also referred to as an ExB filter because it applies to crossing electrical and magnetic fields. The ExB filter cooperates with a diaphragm 7 which is located between the immersion lens 5 and the substrate 9.

Because of its position, the aperture 7a of the diaphragm 7 can have an aperture opening of only about 500 micrometers.

The ion source 1 supplies an ion beam made up of ion rays 12 which, at the output end of the ion source have a very small diameter of about 10 to 50 micrometers. The actual dimension of the diameter of the rays will depend upon the desired resolution. The values given here are for a resolution below 1 micrometer. The diaphragm 7 can be integrated in the projection lens 8.

Between the ion source 1 and the Wien filter 3, an electrostatic preconvergence or precondensing lens 2 also referred to simply as a prelens, can be provided.

Figure 6:
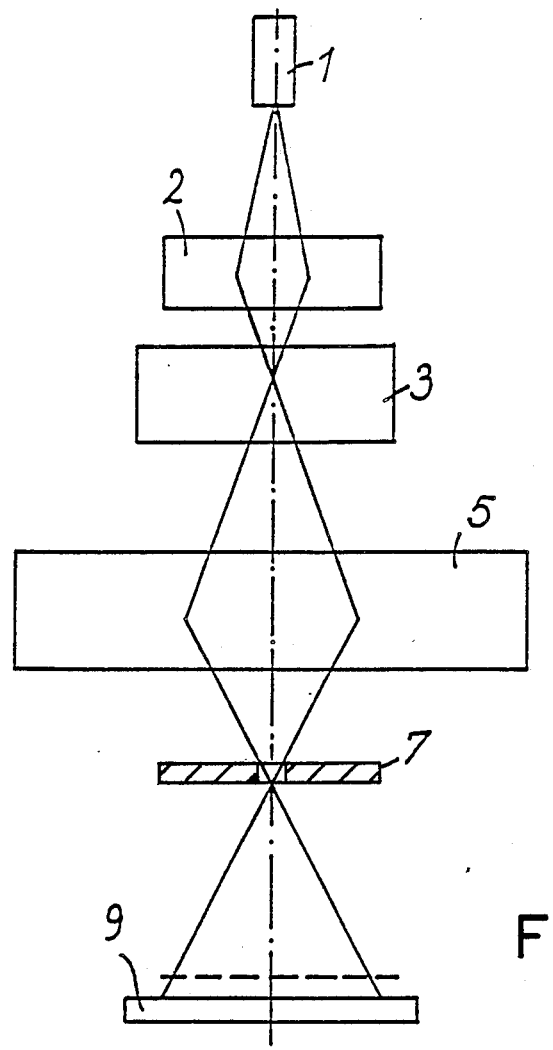
FIG. 6 is a view similar to FIGS. 1 and 1a of an apparatus of the invention for 1:1 shadow projection.

This prelens, shown in FIGS. 1 and 6, generates convergent rays having a crossing point CP' located within the Wien filter 3. By the use of this prelens 2, in the case of shut off of the Wien filter 3, the position of the virtual source, namely the image of the source produced by the prelens, can be adjusted along the optical axis of the projection device.

Upstream of the diaphragm 7 and downstream of the immersion lens 5 in the beam path, a selectively activatable deflecting element 6 for the ion beam can be provided. The deflector 6 serves to generate an electrostatic field. By means of this field, the rays coming from the Wien filter 3 and lying in a plane 10 (FIG. 3) intersecting the aperture 7a in the diaphragm 7 located at 11 can be deflected out of this plane in the direction x and thus out of the region 11 of the aperture. The rays are thus deflected into the plane 10'.

Since the deflector 6 is located along the path of the beam downstream of the mask 4, even after activation of the deflector 6 and a cutoff of the passage of the beam to the substrate, the mask continues to be subjected to the ion beam so that its temperature may remain constant and distortion of the structure, which might result from a cooling of the mask, can be avoided.

The deflecting element 6 can be an octopole (see the aforementioned copending applications), the vectoral action of which has been schematically illustrated in FIG. 2. In this Figure, the potentials $U_1 \ldots U_8$ are applied to the respective poles and to generate a dipole field, these potentials are set at:

$$U_1 = U_o, U_2 = U_o/\sqrt{2}, U_3 = 0, U_4 = U_o/\sqrt{2},$$
$$U_5 = -U_o, U_6 = -U_o/\sqrt{2}, U_7 = 0, U_8 = U_o/\sqrt{2}$$

$$(U_i = U_o \cdot \cos(-\phi),$$

wherein $U_o$ will depend upon the ion energy and the desired degree of shift in the x direction.

In The Wien filter 3, the ions, in dependence of their masses are deflected to a greater or lesser extent with the deflection for a given ion energy being determined by the electrical and magnetic field strengths. FIGS. 1 and 1a show schematically the beam paths of two ion types 12' and 12" with neighboring masses. Since the boundary fields increase with increasing field strengths in the Wien filter and this can lead to distortion of the imaged structure, it is desirable to keep the field strengths and hence the deflection of the beams generated in the ExB filter as small as possible. This is permitted by the invention because the diaphragm 7 is located at a relatively large distance s (compare FIGS. 4 and 5) from the Wien filter so that even with small deflection angles, the undesirable ions will be caused to impinge upon a region of the diaphragm which does not have a diaphragm aperture 7a or 11.

The comparison of the different distances s between the Wien filter 3 and the plane of the diaphragm 7 in FIGS. 4 and 5 shows without difficulty that in these examples the undesirable deuterium and tritium can be deflected out of the line of the aperture with substantially less energy than is the case with the construction of FIG. 4.

In FIG. 6 I have shown a projection system which does not make use of a mask between the Wien Filter 3 and the immersion lens, but rather provides a mask M proximal to the substrate. The projection lens may here be omitted.

I claim:

1. An apparatus for demagnification or full-size ion projection lithography, comprising:
    an ion source for projecting an ion beam along a path;
    a structured mask disposed along said path;
    an image plane disposed along said path and receiving an image of the structure of said mask projected onto the image plane by said ion beam;
    an immersion lens between said mask and said image plane along said path for focussing said ion beam and forming a crossing point for ion rays thereof;
    a projection lens along said path;
    a Wien ExB mass-separation filter along said path between the source and the mask; and
    a diaphragm cooperating with said Wien ExB mass-separation filter and provided with an aperture passing a predetermined kind of ions generated by said source and intercepting ions different from said predetermined kind upon deflection by said filter, said diaphragm being positioned between said immersion lens and said image plane at a distance from said Wien ExB mass-separation filter so as to substantially reduce the distortion caused by the diffraction of said filter.

2. The apparatus for demagnification or full-size ion projection lithography defined in claim 1 wherein said aperture has a diameter of about 500 micrometers.

3. The apparatus for demagnification or full-size ion projection lithography defined in claim 1 wherein said projection lens is an Einzel lens unit.

4. The apparatus for demagnification or full-size ion projection lithography defined in claim 1 including means for supporting a wafer at the image plane for the production of semiconductor circuit elements.

5. The apparatus for demagnification or full-size ion projection lithography defined in claim 1 wherein said diaphragm is integrated in the projection lens, being at the same time the entrance aperture of said lens.

6. The apparatus for demagnification or full-size ion projection lithography defined in claim 1, further comprising an electrostatic precondensing lens disposed along said path between said Wien ExB mass-separation filter and said source and converging the ion rays of said beam to a crossing point in said Wien ExB mass-separation filter.

7. The apparatus for demagnification or full-size ion projection lithography defined in claim 6, further comprising a selectively activatable electrostatic-fieldgenerating deflector along said path between said diaphragm and said source.

8. The apparatus for demagnification or full-size ion projection lithography defined in claim 7 wherein said selectively activatable eletrostatic-field-generating deflector is an electrostatic multipole.

9. The apparatus for demagnification or full-size ion projection lithography defined in claim 8 wherein said selectively activatable electrostatic-field-generating deflector is an electrostatic octopole.

10. The apparatus for demagnification or full-size ion projection lithography defined in claim 9 wherein said aperture has a diameter of about 500 micrometers.

11. The apparatus for demagnification or full-size ion projection lithography defined in claim 10 wherein said projection lens is an Einzel lens unit.

12. The apparatus for demagnification or full-size ion projection lithography defined in claim 11 including means for supporting a wafer at the image plane for the production of semiconductor circuit elements.

13. The apparatus for demagnification or full-size ion projection lithography defined in claim 12 wherein said diaphragm is integrated in the projection lens, being at the same time the entrance aperture of said lens.

14. The apparatus for demagnification or full-size ion projection lithography defined in claim 1, further comprising a selectively activatable electrostatic-field-generating deflector along said path between said diaphragm and said source.

15. The apparatus for demagnification or full-size ion projection lithography defined in claim 14 wherein said selectively activatable electrostatic-field-generating deflector is an electrostatic multipole.

16. The apparatus for demagnification or full-size ion projection lithography defined in claim 15 wherein said selectively activatable electrostatic-field-generating deflector is an electrostatic octopole.

17. A method for demagnification or full-size ion projection lithograph in a lithography apparatus including an ion source for providing an ion beam for illuminating a structured mask, and a lens means for focussing said beam, the method comprising:

filtering said ion beam with a Wien ExB mass-separation filter generating deflection fields and a diaphragm cooperating with said Wien ExB mass-separation filter and provided with an aperture passing a predetermined kind of ions generated by said source and intercepting ions different from said predetermined kind upon deflection by said filter, and, positioning said filter upstream of said lens means and said diaphragm downstream of said lens means at a distance from said filter to substantially reduce distortion of said image by said deflection fields from said Wien ExB mass-separation filter.

18. The method of claim 17 wherein said lens means forms a crossing point and said positioning includes positioning said diaphragm adjacent to said crossing point.

* * * * *